US006778569B2

(12) United States Patent
Fischer

(10) Patent No.: US 6,778,569 B2
(45) Date of Patent: Aug. 17, 2004

(54) OPTICAL SOURCE DRIVER WITH IMPROVED INPUT STAGE

(75) Inventor: Jonathan H. Fischer, Longmont, CO (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 10/002,028

(22) Filed: Nov. 15, 2001

(65) Prior Publication Data

US 2003/0091076 A1 May 15, 2003

(51) Int. Cl.[7] .................................................. H01S 3/00
(52) U.S. Cl. .............................. 372/38.02; 372/38.07; 372/38.1
(58) Field of Search ............................. 372/38.02, 38.1

(56) References Cited

U.S. PATENT DOCUMENTS

| 5,734,296 | A | * | 3/1998 | Dotson et al. | ............... 330/253 |
| 5,883,910 | A | * | 3/1999 | Link | ........................... 372/38 |
| 5,986,481 | A | * | 11/1999 | Kaminishi | .................... 372/96 |
| 6,037,832 | A | * | 3/2000 | Kaminishi | ................... 327/538 |
| 6,466,595 | B2 | * | 10/2002 | Asano | .......................... 372/29 |

OTHER PUBLICATIONS

P.R. Gray et al., "Analysis and Design of Analog Integrated Circuits," Third Edition, John Wiley & Sons, Inc., pp. 227–228, 1993.
Alan B. Grebene, "Bipolar and MOS Analog Integrated Circuit Design," John Wiley & Sons, Inc., pp. 215–216 and 278–280, 1984.

* cited by examiner

Primary Examiner—Don Wong
Assistant Examiner—Leith A Al Nazer

(57) ABSTRACT

A driver circuit for a laser diode or other optical source includes an input stage, an output stage, and a current generator circuit. The current generator circuit is adapted to establish a modulation current for application to one of a first output and a second output of the output stage in accordance with a differential input data signal applied to the input stage. The input stage includes first and second differential pairs. The first differential pair has the differential input data signal applied thereto, is implemented using MOS devices, and has substantially unity gain. The second differential pair receives as its inputs corresponding outputs of the first differential pair, is implemented using bipolar devices, and has a gain greater than unity. The first and second differential pairs are thus configured such that application of the differential input data signal at a substantially rail-to-rail voltage swing to the first differential pair will not exceed a junction reverse bias constraint of the second differential pair.

18 Claims, 5 Drawing Sheets

OPTICAL SOURCE DRIVER WITH IMPROVED INPUT STAGE

RELATED APPLICATION

The present invention is related to the invention described in U.S. patent application Ser. No. 09/949,592, filed Sep. 10, 2001 in the name of inventor J. H. Fischer and entitled "Optical Source Driver with Bias Circuit for Controlling Output Overshoot," which is incorporated by reference herein.

FIELD OF THE INVENTION

The present invention relates generally to circuits for supplying drive current to lasers or other optical sources, and more particularly to input stage circuitry for a laser driver or other optical source driver.

BACKGROUND OF THE INVENTION

Laser diodes and other types of semiconductor lasers are in widespread use as optical sources in high-speed optical data transmission applications. Laser diodes are particularly desirable in such applications due to their high optical output power and spectral purity. A laser driver circuit, also referred to herein as simply a "driver," is used to supply appropriate drive current to a semiconductor laser, so as to control the optical output signal between an "on" state corresponding to a logic one level and an "off" state corresponding to a logic zero level, in accordance with the data to be transmitted.

Conventional semiconductor laser driver circuits are described in U.S. Pat. No. 5,883,910, issued Mar. 16, 1999 in the name of inventor G. N. Link and entitled "High Speed Semiconductor Laser Driver Circuits," which is incorporated by reference herein.

When implementing a laser driver circuit in a high-speed application, e.g., a data transmission system operating at a rate of about 2.5 Gbits per second or more, Silicon-Germanium (SiGe) bipolar transistors are often used. The SiGe bipolar transistors can accommodate the high data rate while also saving power compared to standard bipolar or CMOS technologies. However, such SiGe transistors generally have a very thin base region, and as a result the base-emitter reverse bias must be limited to no more than about 1 volt in order to avoid damage to the base junction. This stringent base-emitter reverse bias constraint adversely impacts the design of interface circuitry, such as high-speed pseudo-ECL (PECL) input circuits used to interface data and clock inputs to the laser driver circuit input stage. More particularly, the PECL input specifications calls for inputs as large as 1.6 volts, which can violate the base-emitter reverse bias constraint in the laser driver input stage, particularly at higher temperatures. This in turn can lead to long-term performance degradation or other types of damage for the input stage transistors.

It should be noted that differential signaling is preferred in high-speed applications in order to reject ground noise and control output switching transients, thereby allowing smaller signal swings for a given bit error rate.

Current practice in addressing the base-emitter reverse bias constraint is to restrict the input differential voltage swing applied to the laser driver input stage to about 1.5 volts or less, or to provide input clamping circuitry. The former approach is undesirable in that it is inconsistent with the above-noted PECL specification and requires additional care in device testing and manufacturing. The clamping approach, while being acceptable for low-speed applications, can unduly limit the maximum operating speed of the driver, and is therefore impractical in high-speed applications.

It is therefore apparent that a need exists for improved optical source driver circuits which are configured to accommodate full differential input voltage swings without unduly impacting operating speed.

SUMMARY OF THE INVENTION

The invention provides improved optical source driver circuits which meet the above-noted need.

In accordance with one aspect of the invention, a driver circuit for a laser diode or other optical source includes an input stage, an output stage and a current generator circuit. The current generator circuit is adapted to establish a modulation current for application to one of a first output and a second output of the output stage in accordance with a differential input data signal applied to the input stage. The input stage includes first and second differential pairs. The first differential pair has the differential input data signal applied thereto, is implemented using MOS devices, and has substantially unity gain. The second differential pair receives as its inputs corresponding outputs of the first differential pair, is implemented using bipolar devices, and has a gain greater than unity. More particularly, the first and second differential pairs are configured such that application of the differential input data signal at a substantially rail-to-rail voltage swing to the first differential pair will not exceed a junction reverse bias constraint of the second differential pair.

Advantageously, the invention permits an optical source driver circuit to accommodate full differential input voltage swings, i.e., substantially rail-to-rail input voltage swings, while also maintaining the ability of the driver circuit to operate at high speeds.

DETAILED DESCRIPTION OF THE INVENTION

The present invention will be illustrated herein using exemplary semiconductor laser driver circuits. It should be understood, however, that the particular circuits shown are by way of illustrative example only, and the techniques of the invention are more generally applicable to a wide variety of other optical source drivers. Moreover, although illustrated using a laser diode optical source, the invention can of course be utilized with other types of optical sources.

The general operating characteristics of an illustrative embodiment of the invention will initially be described with reference to the simplified diagrams of FIGS. 1 and 2. More detailed schematic diagrams showing an example laser driver circuit and the particular type of laser driver input stage utilized in the illustrative embodiment will be described in conjunction with FIGS. 3, 4, 5 and 6.

Figure 1:
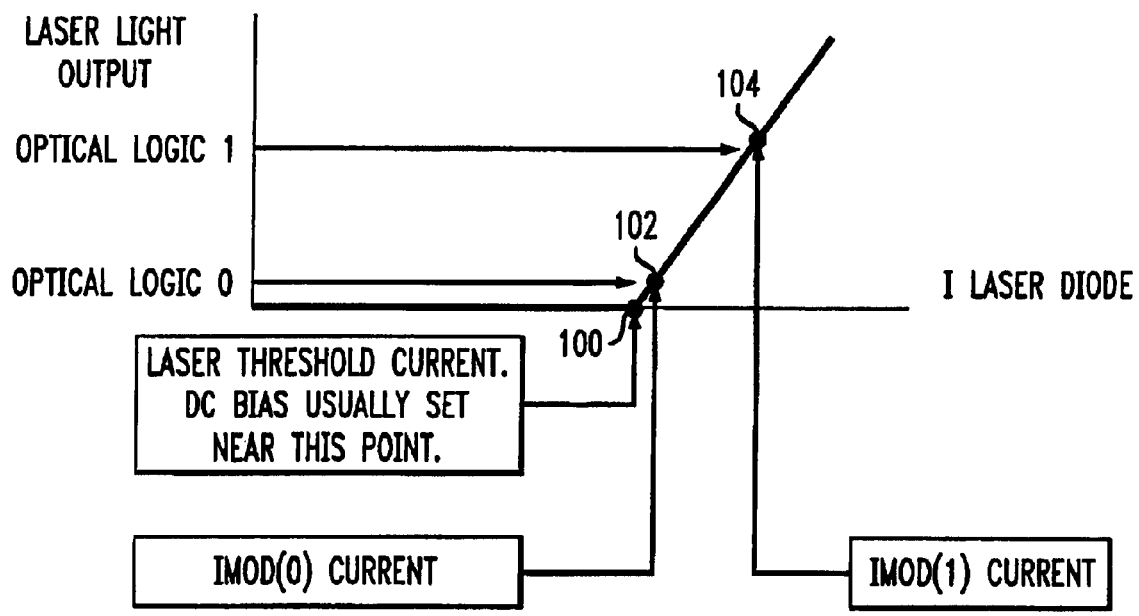
FIG. 1 is a plot of laser diode output as a function of drive current in an illustrative embodiment of the invention.

FIG. 1 shows laser diode light output as a function of diode current in an illustrative embodiment of the invention. Point 100 on the plotted output characteristic corresponds to the laser 5 threshold current. This is the point at which further increases in current will generate laser light output. It is generally desirable in high-speed optical data transmission applications for the direct current (DC) bias of the laser diode to be set at or near this point. Points 102 and 104 on the plotted characteristic correspond to respective low and high modulation current levels IMOD(0) and IMOD(1). These current levels are associated with generation of an optical logic zero output and 110 an optical logic one output, respectively. It is assumed for simplicity and clarity of description that a high level optical output is a logic one and a low level optical output is a logic zero, although it is to be appreciated that this is not a requirement of the invention.

It should also be noted that the particular output characteristic as shown in FIG. 1 is illustrative only, and the invention can be used with optical sources having other types of output characteristics.

Figure 2:
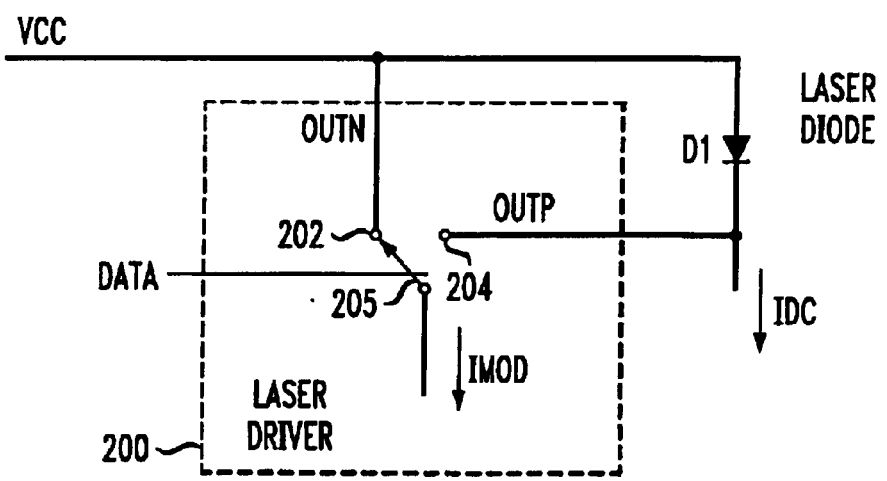
FIG. 2 shows a simplified diagram of a laser diode optical source and an associated laser driver circuit in which the present invention is implemented.

FIG. 2 shows a portion of an optical system transmitter in accordance with the invention. The portion of the transmitter as shown includes a laser driver circuit 200 and a laser diode D1. A DC bias current IDC is applied to the laser diode D1 as indicated by an associated DC bias circuit (not shown). As indicated previously, the DC bias current IDC is used to bias the laser diode D1 up to an appropriate threshold, such that the modulation circuitry need only drive enough current to switch the laser diode between the logic low output level and the logic high output level.

The laser driver circuit 200 includes a data input and negative and positive outputs denoted OUTN (terminal 202) and OUTP (terminal 204), respectively. The applied data in this simplified diagram serves to control the position of switch 205 such that the low modulation current IMOD(0) is applied to the laser diode D1 when the data is at a logic low level, and the high modulation current IMOD(1) is applied to the laser diode D1 when the data is at a logic high level. This occurs through direction of the modulation current IMOD via switch 205 and the OUTN terminal 202 to upper supply voltage VCC when the input data is at a logic low level, and via switch 205 and the OUTP terminal 204 to the anode of laser diode D1 when the input data is at a logic high level.

The description herein assumes that the IMOD(0) and IMOD(1) levels as shown in FIG. 1 are normalized to the applied DC bias current, such that when IMOD(0) or IMOD(1) is indicated as being applied to the laser diode D1, the total applied current is the sum of the DC bias current IDC and the particular modulation current IMOD(0) or IMOD(1). It should be noted that the IMOD(0) current may be zero, i.e., points 100 and 102 in FIG. 1 may be the same, such that the applied current in this case is only the DC bias current IDC.

The laser driver 200 is particularly well-suited for use in an optical system that includes multiple laser driver modules, each supplying drive current for a corresponding laser diode. In such an application, there may be significant advantages in minimizing the overall system power in order to allow higher integration. One possible technique is to configure a given laser driver module so as to drive the corresponding laser diode with just enough current to meet the system optical power specification. When the laser diode is new, little current is needed to meet this specification. However, as the laser diode ages, more current is needed. To handle expected production variation and laser diode aging, the above-described modulation current (IMOD) may be specified, e.g., over a 12:1 range (such as 5 mA to 60 mA). The system may also require a particular ratio of the "on" state current (Ion) to "off" state current (Ioff) for the laser diode, e.g., an Ion:Ioff ratio of 10:1 or greater. With reference to FIG. 1, the laser diode D1 is considered to be in the on state upon application of the high modulation current IMOD(1) and in the off state upon application of the low modulation current IMOD(0).

Figure 3:
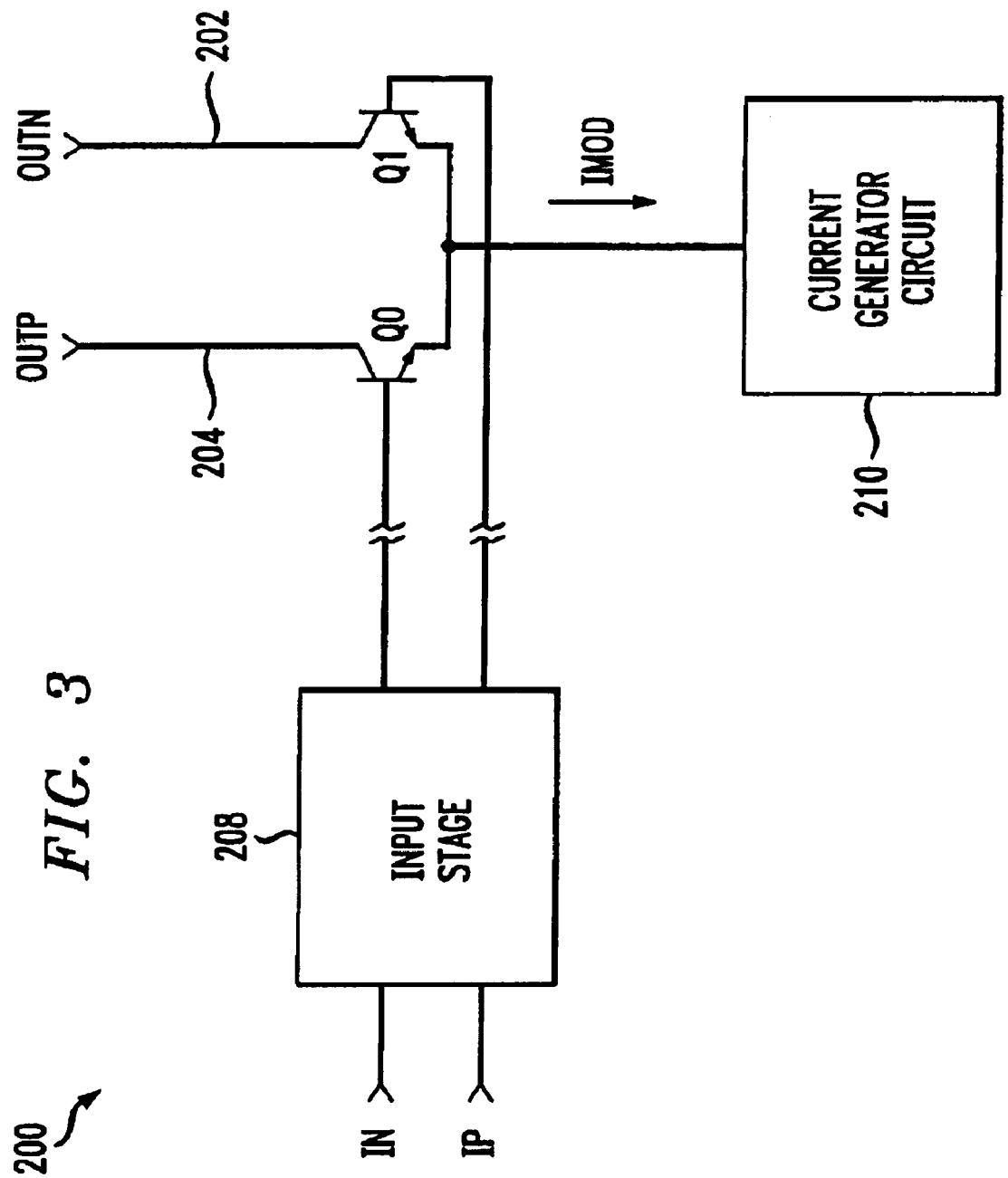
FIG. 3 is a schematic diagram of the laser driver of FIG. 2.

FIG. 3 shows a more detailed view of one possible implementation of the laser driver 200 of FIG. 2 in accordance with the invention. The laser driver 200 as shown includes an output stage differential pair comprising transistors Q0 and Q1, an input stage 208, and a current generator circuit 210. The laser driver 200 may include one or more intermediate stages between the input stage 208 and the output stage, although such intermediate stages are not shown in the figure. The input stage 208 is driven directly by differential data inputs IN and IP. The output stage differential pair (Q0, Q1) corresponds generally to switch 205 of FIG. 2. The current generator circuit 210 generates the above-noted IMOD current, which as previously indicated may be in a range from about 5 mA to 60 mA. Techniques for generating the IMOD current and other currents associated with the laser driver 200, in a manner that reduces output overshoot of the laser driver, are described in the above-cited U.S. patent application Ser. No. 09/949,592.

The modulation current IMOD is applied via one of the transistors Q0 or Q1 of the output stage differential pair to respective output terminal OUTP 204 or OUTN 202, in accordance with the differential data inputs IN and IP.

Additional details regarding the operation of the differential pair (Q0, Q1) of the laser driver 200 can be found in, e.g., A. B. Grebene, "Bipolar and CMOS Analog Integrated Circuit Design," John Wiley & Sons, 1984, ISBN 0-471-08529-4, which is incorporated by reference herein.

The present invention in the illustrative embodiment provides an improved input stage 208 that can accommodate full rail-to-rail differential input voltages, without adversely impacting the speed of operation.

It should be noted that the term "substantially rail-to-rail voltage swing" as used herein is intended to include any input voltage swing which would otherwise violate a reverse bias constraint of an input stage differential pair absent the use of the techniques of the present invention.

As indicated previously, the current practice in addressing the base-emitter reverse bias constraint associated with SiGe bipolar transistors is to restrict the input differential voltage swing applied to the laser driver input stage to about 1.5 volts or less, or to provide input clamping circuitry. Examples of these approaches will be illustrated in FIGS. 4 and 5, respectively, with regard to a particular input stage circuit in which the present invention may be implemented. The manner in which the particular input stage circuit is configured in accordance with the techniques of the invention will then be described with reference to FIG. 6.

Figure 4:
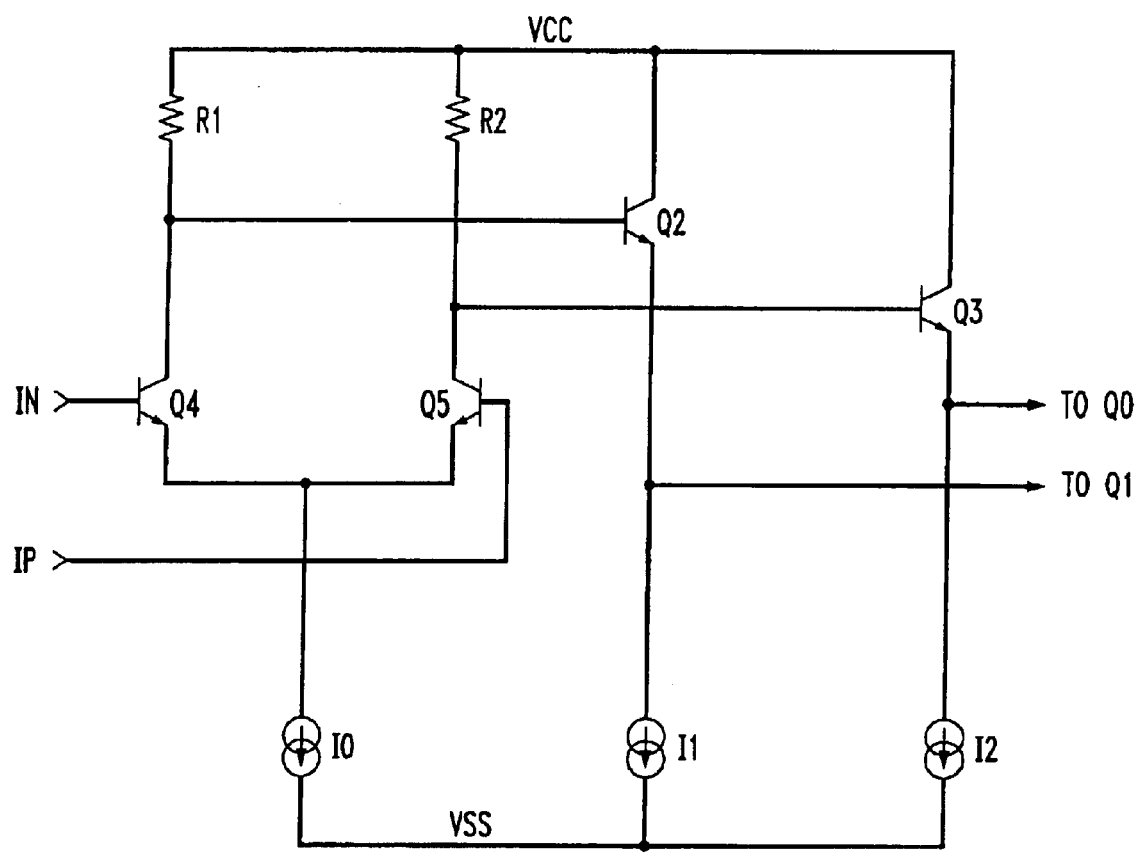
FIGS. 4 and 5 are schematic diagrams of an input stage of the FIG. 3 laser driver without input clamping circuitry and with input clamping circuitry, respectively.

FIG. 4 illustrates an example input stage 208 without the improvements of the present invention. The input stage 208 includes transistors Q2, Q3, Q4 and Q5, current sources I0, I1 and I2, and resistors R1 and R2. It will be assumed for purposes of illustration that the transistors Q2, Q3, Q4 and Q5 are SiGe transistors, although other types of transistors can be used. Transistors Q4 and Q5 are configured as a differential pair, with the differential data inputs IN and IP applied to the respective base terminals of Q4 and Q5. Current source I0 provides a bias current for the (Q4, Q5) differential pair, and is coupled between the interconnected emitter terminals of Q4 and Q5 and the lower supply voltage VSS, which may be ground potential. The collector terminals of Q4 and Q5 are coupled to respective base terminals of transistors Q2 and Q3 as shown. The emitter terminals of Q2 and Q3 may be coupled to the respective base terminals of transistors Q1 and Q0 of the output stage differential pair illustrated in FIG. 3. Current sources I1 and I2 provide bias current for transistors Q2 and Q3, respectively, and are each coupled between an emitter terminal of one of Q2 and Q3 and the lower supply voltage VSS.

Resistors R1 and R2 are coupled between the collector terminals of Q4 and Q5, respectively, and the upper supply voltage VCC. A suitable value for each of the resistors R1 and R2 is 250 ohms, although other values could also be used.

In the input stage circuit of FIG. 4, when the differential input signal is zero, the bias current supplied by the I0 current source is evenly distributed between Q4 and Q5 and these transistors have substantially equal base-emitter (Vbe) voltages. As the IP input is driven more positive than the IN input, the bias current from I0 is steered more through Q5 than Q4, and Vbe for Q5 increases while that for Q4 decreases. At a point when substantially all of the bias current is flowing through Q5, its Vbe remains substantially fixed and the remainder of the differential input voltage reverse biases the base-emitter junction of Q4. As indicated above, for the SiGe bipolar transistors typically used in high-speed applications, the maximum allowed reverse bias on Q4 is only 1 volt, which limits the maximum differential input voltage to 1 volt plus the Vbe of Q5. Although this maximum is approximately 1.7 volts at room temperature, it is reduced to 1.5 volts at 125° C., a value below the maximum PECL input specification of 1.6 volts.

Figure 5:
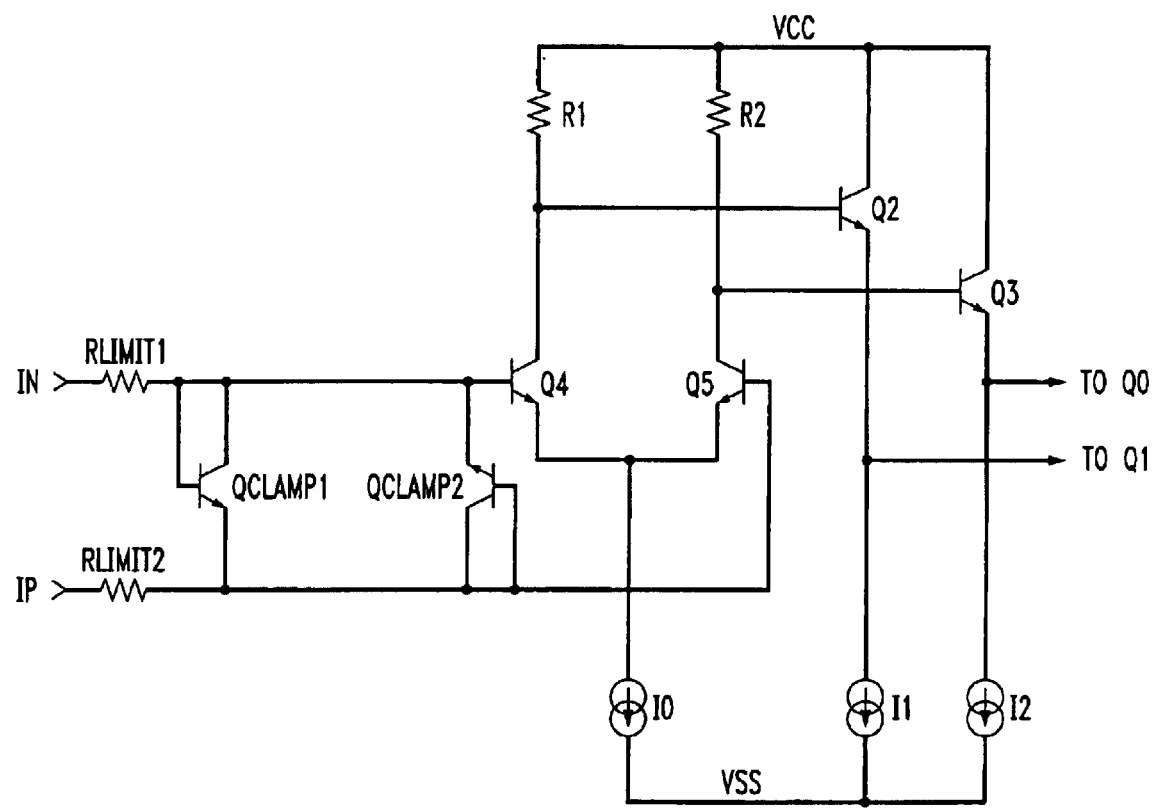

FIG. 5 shows the manner in which input voltage clamping circuitry may be incorporated into the FIG. 4 input stage circuit, in order to avoid exceeding the base-emitter reverse bias constraint of the SiGe transistors. In this example, each of the input terminals IN and IP includes a series resistor RLIMIT1 or RLIMIT2 and a voltage clamp implemented as a diode-connected transistor QCLAMP1 or QCLAMP2. A suitable value for the resistors RLIMIT1 and RLIMIT2 may be 1 kohm, although other values may be used. Unfortunately, the clamping approach illustrated in FIG. 5 is generally not well-suited for use at high speeds, e.g., operating speeds on the order of 2.5 Gbits per second or more.

Figure 6:
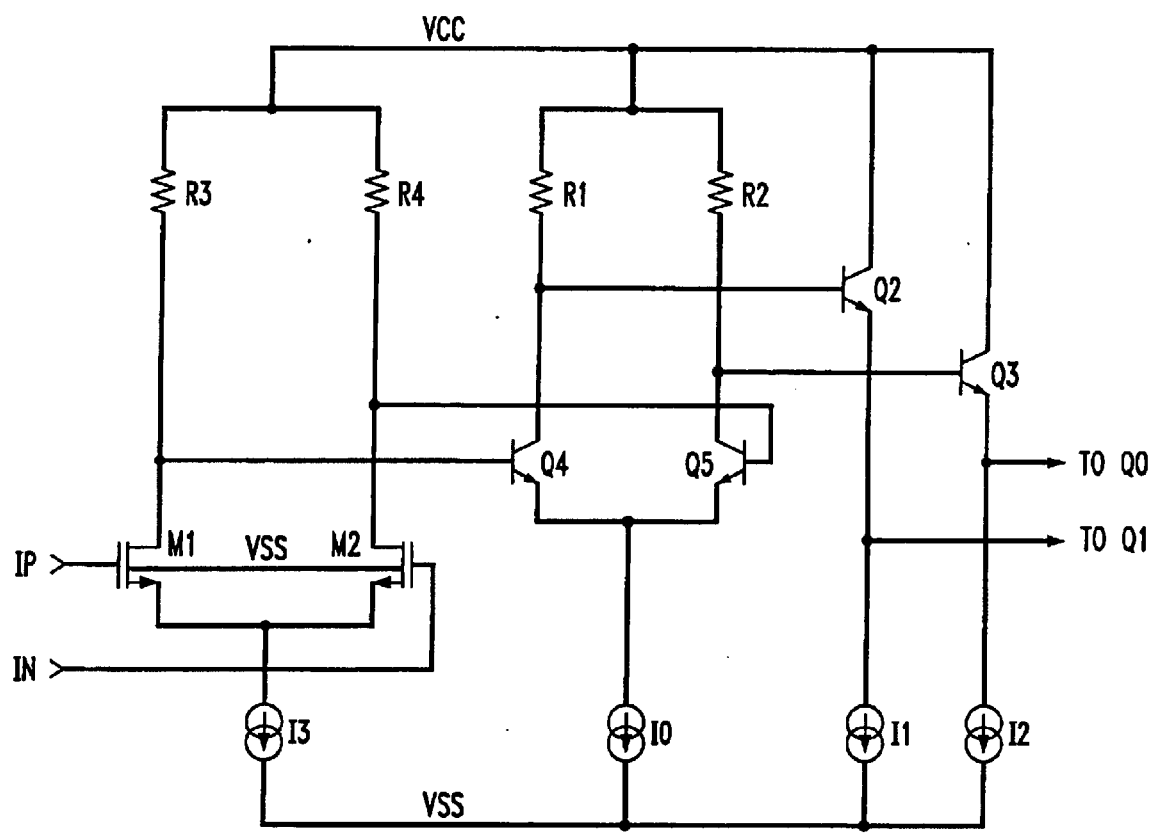
FIG. 6 is a schematic diagram of an input stage of the FIG. 3 laser driver configured in accordance with the illustrative embodiment of the invention.

FIG. 6 shows the input stage 208 configured in accordance with the illustrative embodiment of the invention. A metal-oxide-semiconductor (MOS) differential pair comprising MOS devices M1 and M2 is coupled between the differential inputs IN and IP and the (Q4, Q5) differential pair. More particularly, inputs IN and IP are coupled to respective gate terminals of M2 and M1, while drain terminals of M1 and M2 are coupled via respective resistors R3 and R4 to the upper supply voltage VCC. The drain terminals of M1 and M2 are also coupled to the base terminals of transistors Q4 and Q5, respectively. A suitable value for each of the resistors R3 and R4 is 500 ohms, although other values could also be used.

The sources of the devices M1 and M2 are coupled together and via a current source I3 to the lower supply voltage VSS. The MOS devices M1 and M2 may each have width/length dimensions of approximately 24/0.32 in micrometers ($\mu$m). These dimensions are examples only, and not requirements of the invention. The MOS devices can be formed, e.g., using a conventional 0.25 $\mu$m CMOS process.

The remaining portion of the FIG. 6 circuit is configured substantially as described in conjunction with FIG. 4.

In accordance with the invention, the MOS input circuit comprising devices M1 and M2 is configured to have a gain of one, i.e., the MOS input differential pair is configured as a substantially unity gain circuit. The MOS circuit can tolerate full supply differential input signals but generally does not have enough speed to be used in a normal differential amplifier with gain. Therefore, the MOS circuit is configured to have unity gain, and the bipolar differential pair Q4, Q5 is configured to provide the desired gain. The MOS circuit thus serves to isolate the (Q4, Q5) differential pair from large differential input swings at the IN and IP inputs. By configuring the MOS circuit for unity gain, its Miller capacitance effects and device size can be minimized, such that operating speed of the laser driver 200 is not unduly impacted. The maximum differential voltage seen by the bipolar (Q4, Q5) differential pair stage is limited to I3×R3, and may be set by design to a value on the order of about 0.2 volts.

The FIG. 6 laser driver input stage 208 is thus configured to meet the base-emitter reverse bias constraint for the SiGe bipolar devices thereof, without the need for conventional input clamping circuitry and in a manner which does not unduly limit the operating speed of the laser driver circuit 200. For example, a laser driver utilizing the input stage of FIG. 6 can operate with the full PECL input specification range of 0.2 to 1.6 volt peak differential inputs, without risking damage to the SiGe bipolar devices.

The current sources I0, I1, I2 and I3, and other current sources or generators referred to herein, may be configured in a straightforward manner using well-known conventional techniques, as will be apparent to those skilled in the art. For example, such sources or generators can be configured using appropriately-sized MOS devices, as will be readily appreciated by those skilled in the art.

The term "current generator circuit" as used herein is intended to include a single current source or other circuit which generates each of the above-noted currents, as well as portions or combinations of multiple circuits each of which generates a particular one of the currents.

It should be noted that the improved input stage described herein in conjunction with FIG. 6 may be used with circuits other than the laser driver circuit of the illustrative embodiment of FIGS. 2 and 3. For example, the input stage may be used in any other type of multi-stage circuit having an input stage with a differential pair comprised of bipolar transistors for which there is a known reverse bias constraint. A limiting amplifier is a more particular example of a multi-stage circuit other than an optical source driver in which the invention may be implemented. The invention can also be implemented in a variety of other amplifier or non-amplifier circuits.

The particular embodiments of the invention as described herein are intended to be illustrative only. For example, as previously indicated, different device types and circuit configurations may be used in other embodiments. As another example, the particular MOS input circuit configuration shown in FIG. 6 may be replaced with other types of MOS circuits designed to provide the functionality described herein. Furthermore, although illustrated using multiple differential circuits, a laser driver or other circuit in accordance with the invention can also be implemented using one or more single-ended circuits. In such an embodiment, a given single-ended data signal may be converted to a differential data signal within the driver circuit or other circuit. These and numerous other alternative embodiments within the scope of the following claims will be readily apparent to those skilled in the art.

What is claimed is:

1. A driver circuit for an optical source, the driver circuit comprising:
   at least an input stage and an output stage, the output stage being operatively coupled to the input stage; and
   a current generator circuit adapted to establish a modulation current for application to one of a first output and a second output of the output stage in accordance with a differential input data signal applied to the input stage;
   the input stage being configured to include first and second differential pairs;
   the first differential pair having the differential input data signal applied thereto, and being implemented using MOS devices;
   the second differential pair comprising an emitter-coupled differential pair and receiving as its inputs corresponding outputs of the first differential pair, and being implemented using bipolar devices;
   the first and second differential pairs being configured such that application of the differential input data signal at a substantially rail-to-rail voltage swing to the first differential pair will not exceed a junction reverse bias constraint of the second differential pair.

2. The driver circuit of claim 1 wherein the optical source comprises a laser diode.

3. The driver circuit of claim 1 wherein the output stage comprises a differential pair.

4. The driver circuit of claim 1 wherein the input data signal comprises a single-ended input data signal configured for conversion internally to the driver circuit to a differential data signal adapted to control application of the modulation current to the first and second outputs of the output stage.

5. The driver circuit of claim 1 wherein the first differential pair is configured to provide substantially unity gain.

6. The driver circuit of claim 1 wherein the second differential pair is configured to provide a gain greater than unity.

7. The driver circuit of claim 1 wherein the bipolar devices of the second differential pair comprise SiGe bipolar transistors having the reverse bias constraint.

8. An integrated circuit comprising:
   at least one driver circuit for an optical source, the driver circuit comprising:
      at least an input stage and an output stage, the output stage being operatively coupled to the input stage; and
      a current generator circuit adapted to establish a modulation current for application to one of a first output and a second output of the output stage in accordance with a differential input data signal applied to the input state;
      the input stage being configured to include first and second differential pairs;
      the first differential pair having the differential input data signal applied thereto, and being implemented using MOS devices;
      the second differential pair comprising an emitter-coupled differential pair and receiving as its inputs corresponding outputs of the first differential pair, and being implemented using bipolar devices;
      the first and second differential pairs being configured such that application of the differential input data signal at a substantially rail-to-rail voltage swing to the first differential pair will not exceed a junction reverse bias constraint of the second differential pair.

9. The integrated circuit of claim 8 wherein the optical source comprises a laser diode.

10. The integrated circuit of claim 8 wherein the output stage comprises a differential pair.

11. The integrated circuit of claim 8 wherein the input data signal comprises a single-ended input data signal configured for conversion internally to the driver circuit to a differential data signal adapted to control application of the modulation current to the first and second outputs of the output stage.

12. The integrated circuit of claim 8 wherein the first differential pair is configured to provide substantially unity gain.

13. The integrated circuit of claim 8 wherein the second differential pair is configured to provide a gain greater than unity.

14. The integrated circuit of claim 8 wherein the bipolar devices of the second differential pair comprise SiGe bipolar transistors having the reverse bias constraint.

15. An apparatus comprising:
    an optical source; and
    a driver circuit coupled to the optical sources the driver circuit comprising:
       at least an input stage and an output stage, the output stage being operatively coupled to the input stage; and
       a current generator circuit adapted to establish a modulation current for application to one of a first output and a second output of the output stage in accordance with a differential input data signal applied to the input stage;
    the input stage being configured to include first and second differential pairs;
    the first differential pair having the differential input data signal applied thereto, and being implemented using MOS devices;
    the second differential pair comprising an emitter-coupled differential pair and receiving as its inputs corresponding outputs of the first differential pair, and being implemented using bipolar devices;
    the first and second differential pairs being configured such that application of the differential input data signal at a substantially rail-to-rail voltage swing to the first differential pair will not exceed a junction reverse bias constraint of the second differential pair.

16. A circuit comprising:
    at least an input stage and an output stage, the output stage being operatively coupled to the input stage;
    the input stage being configured to include first and second differential pairs;
    the first differential pair having a differential input data signal applied thereto, and being implemented using MOS devices;
    the second differential pair comprising an emitter-coupled differential pair and receiving as its inputs corresponding outputs of the first differential pair, and being implemented using bipolar devices;
    the first and second differential pairs being configured such that application of the differential input data signal at a substantially rail-to-rail voltage swing to the first differential pair will not exceed a junction reverse bias constraint of the second differential pair.

17. The circuit of claim 16 wherein the circuit comprises a driver circuit for an optical source.

18. The circuit of claim 16 wherein the circuit comprises a limiting amplifier.

* * * * *